United States Patent
Huang

[19]

[11] Patent Number: 6,117,723
[45] Date of Patent: Sep. 12, 2000

[54] SALICIDE INTEGRATION PROCESS FOR EMBEDDED DRAM DEVICES

[75] Inventor: Jenn Ming Huang, Hsin-Chu, Taiwan

[73] Assignee: Taiwan Semiconductor Manufacturing Company, Hsin-Chu, Taiwan

[21] Appl. No.: 09/329,781

[22] Filed: Jun. 10, 1999

[51] Int. Cl.$^7$ .................................................. H01L 21/8242
[52] U.S. Cl. ............................................................ 438/238
[58] Field of Search ........................... 438/238, 253–256, 438/381, 396–399

[56] References Cited

U.S. PATENT DOCUMENTS

| | | | |
|---|---|---|---|
| 5,134,085 | 7/1992 | Gilgen . | |
| 5,702,988 | 12/1997 | Liang | 438/238 |
| 5,858,831 | 1/1999 | Sung | 438/241 |
| 5,863,820 | 1/1999 | Huang | 438/241 |
| 5,866,451 | 2/1999 | Yoo et al. | 438/241 |
| 5,879,986 | 3/1999 | Sung | 438/253 |

*Primary Examiner*—Jey Tsai
*Attorney, Agent, or Firm*—George O. Saile; Stephen B. Ackerman

[57] ABSTRACT

A process for integrating the fabrication of DRAM devices, with NFET, and PFET logic devices, on the same semiconductor chip, has been developed. The process features the simultaneous formation of metal silicide layers, on the top surfaces of the NFET and PFET, polysilicon gate structures, as well as on the top surface of an N type doped, polysilicon layer, to be used for subsequent formation of the DRAM polysilicon gate structures. The formation of metal silicide layer also is realized on the heavily doped source/drain regions, of the NFET and PFET logic devices, but is intentionally prevented on the DRAM source/drain regions, to minimize junction leakage. In addition, this integrated fabrication process, allows the doping of the DRAM polysilicon gate structure to be accomplished without an additional photolithographic masking step.

22 Claims, 13 Drawing Sheets

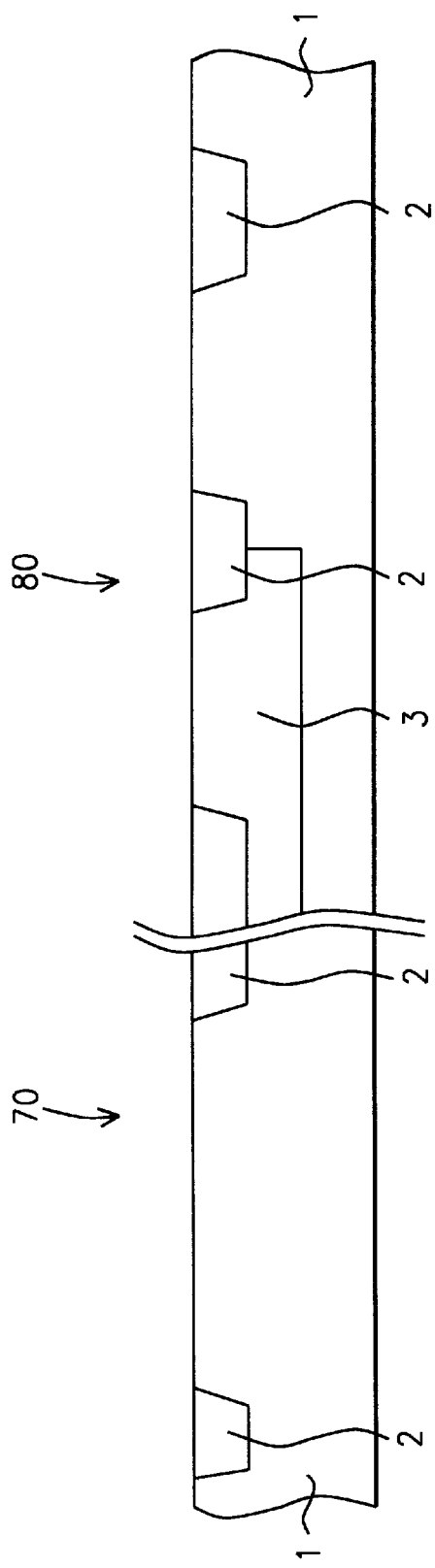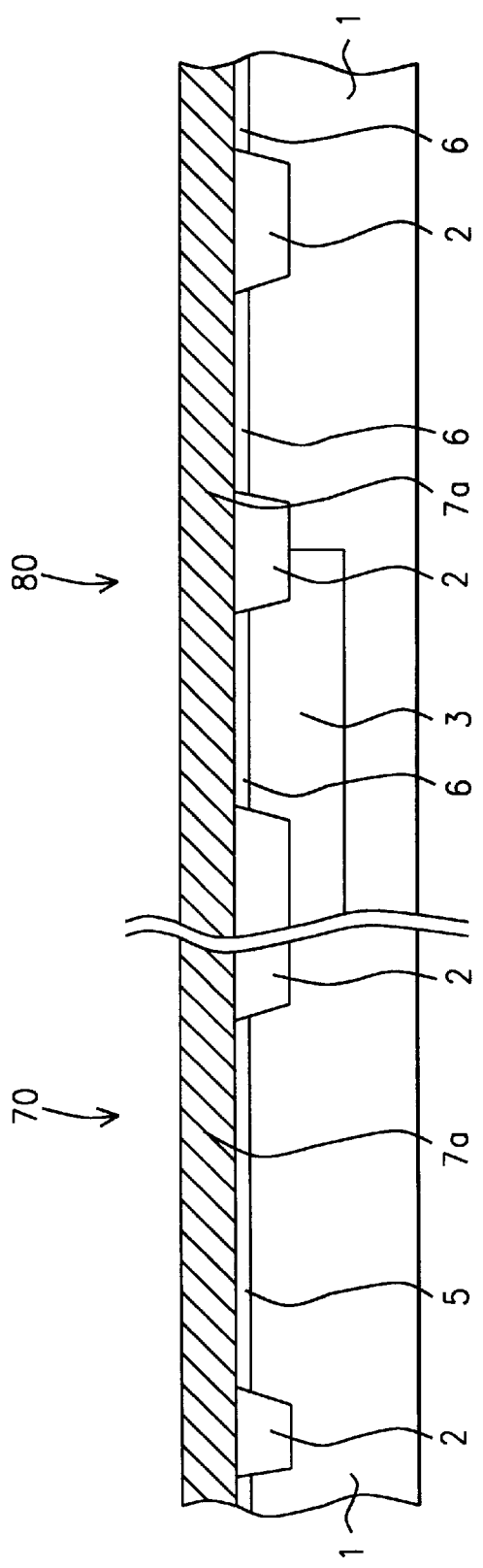

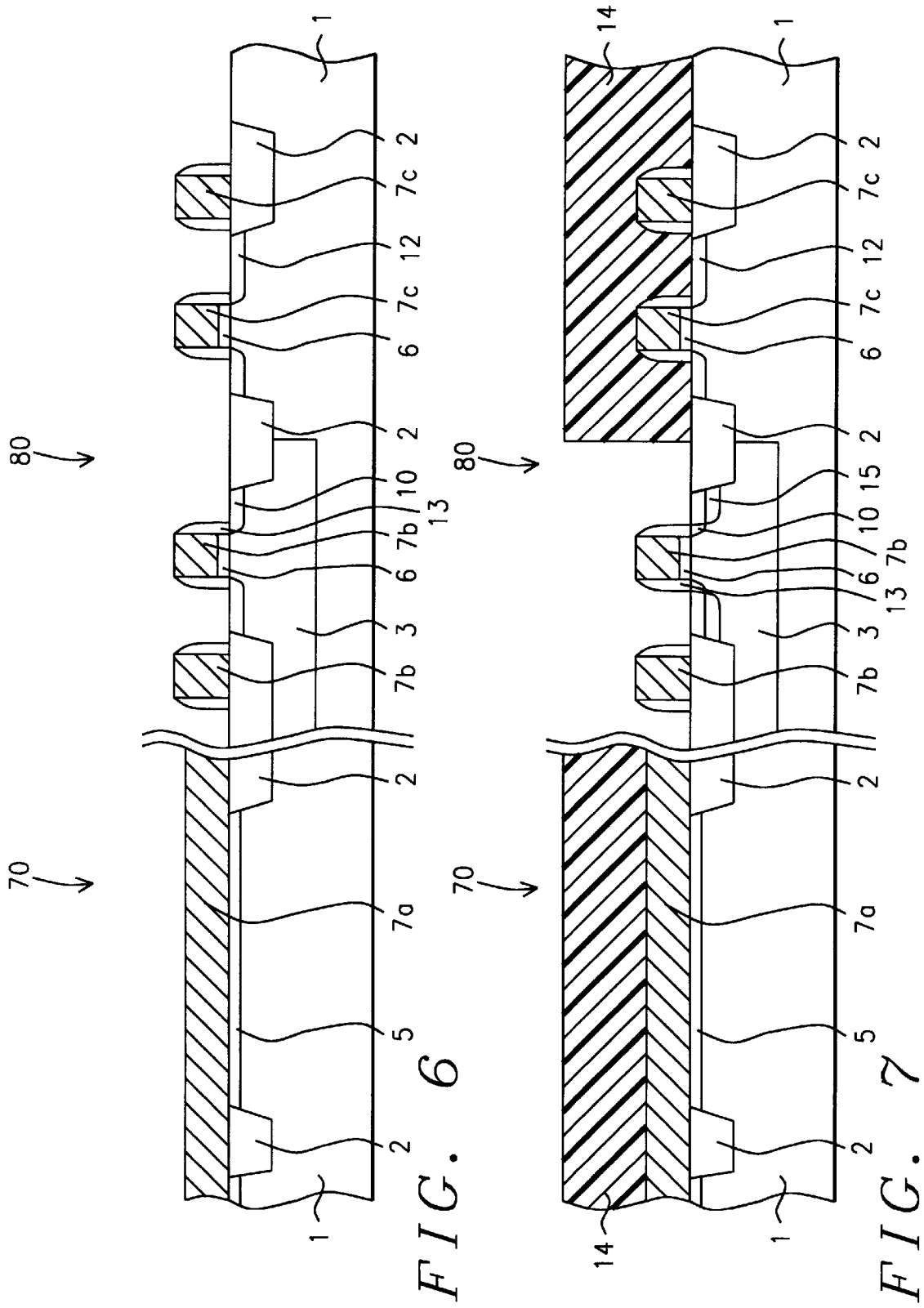

SALICIDE INTEGRATION PROCESS FOR EMBEDDED DRAM DEVICES

BACKGROUND OF THE INVENTION (1) Field of the Invention

The present invention relates to methods used to fabricate semiconductor devices, and more specifically to a process used to integrate the fabrication of logic devices, and dynamic random access memory, (DRAM), devices, on the same semiconductor chip.

(2) Description of Prior Art

The semiconductor industry is continually striving to increase device, as well as chip performance. The ability to form logic devices, and memory devices, such as embedded DRAM devices, on the same semiconductor chip, via novel process integration procedures, has resulted in a decrease in performance degrading resistances, when compared to counterparts in which additional metal wiring, accomplished during packaging procedures, is needed to connect the logic chips to the memory chips. This invention will describe a novel fabrication process, allowing integration of high performance logic devices, and embedded DRAM devices, on the same semiconductor chip, however this invention will feature the integration of process sequences, needed to obtain superior logic devices, without degrading of the DRAM devices. For example Self-ALigned metal silICIDE, (SALICIDE), regions are formed for the gate as well as for the source/drain regions of the logic devices,, while only forming SALICIDE on the DRAM gate structures. This combination, obtained as a result of the process sequence described in this invention, results in a reduction in DRAM junction leakage, when compared to DRAM counterparts, fabricated using a salicide region on the source/drain area. In addition the integration process described in this invention also results in a reduction in processing costs, as a result of: doping of the DRAM polysilicon gate structure, without additional photolithographic masking procedures; creation of the DRAM lightly doped source/drain regions, without additional photolithographic masking; and the simultaneous saliciding of both the logic, and DRAM gate structures. Prior art, such as Yoo et al, in U.S. Pat. No. 5,866,451, as well as Liang, in U.S. Pat. No. 5,702,988, describe processes in which both logic and memory devices are formed on the same semiconductor chip, however those prior arts do not describe the novel sequence of process steps, used in the present invention, which offer yield enhancements, (non-salicided DRAM source/drain), as well as cost reductions, in terms of reductions in photolithographic masking procedures, resulting form the sharing of specific process steps.

SUMMARY OF THE INVENTION

It is an object of this invention to fabricate logic type, complementary metal oxide semiconductor, (CMOS), devices, and embedded DRAM devices, on the same semiconductor chip.

It is another object of this invention to use a single doping step, to simultaneously dope the gate structures for both the logic and DRAM devices.

It is still another object of this invention to simultaneously form a metal silicide layer, on the gate structures of both logic and DRAM devices.

It is yet another object of this invention to avoid formation of a metal silicide layer, on the source/drain region of the DRAM devices.

It is still yet another object of this invention to form the lightly doped source/drain, (LDD), region, for the DRAM device, without the use of a independent photolithographic masking step.

In accordance with the present invention a process has been developed allowing integration of CMOS logic and DRAM devices, featuring: one step for doping of both N type logic, and DRAM gate structures; one step for forming metal silicide layers on the gate structures of both logic and DRAM devices; the formation of the DRAM LDD region, without the use of additional photolithographic masking step; and the ability to avoid formation of metal silicide on the DRAM LDD regions. After formation of a second gate insulator layer in a region of the semiconductor substrate to be used for DRAM devices, a first, thinner, gate insulator layer, is thermally grown in a region of the semiconductor substrate to be used for the logic devices. An undoped polysilicon layer is deposited, followed by a patterning procedure, resulting in the formation of polysilicon gate structures, in the logic region. Conventional photolithographic and ion implantation procedures, are next employed to create N type, LDD regions for N channel, (NFET), logic devices, and to create P type, LDD regions, for the PFET logic devices. After formation of insulator spacers, on the sides of the polysilicon gate structures, in the logic region, conventional photolithographic and ion implantation procedures are again used to create N type, heavily doped source/drain regions, for the NFET logic devices, and P type, heavily doped source/drain regions for the PFET logic devices. The N type, ion implantation procedure, used to create the heavily doped, N type source/drain regions, also dopes the gate structures, of the NFET logic devices, as well doping the undoped polysilicon layer, in the DRAM region, while the gate structures, for the PFET logic devices, are doped P type, during the formation of the P type, heavily doped, source/drain region.

A metal silicide layer is next selectively formed on all exposed regions of silicon or polysilicon, encompassing all gate structures, and all heavily doped source/drain regions in the logic device region, while forming the metal silicide layer on the top surface of the blanket polysilicon layer, in the DRAM region. An insulator layer, such as silicon nitride, or silicon oxynitride, is next deposited, to provide the needed material for subsequent borderless, or self-aligned contact structures, in the logic device region. Patterning procedures are next used to create the gate structures, in the DRAM region, followed by formation of the DRAM LDD regions. An inter-polysilicon oxide, (IPO-1), layer is next deposited, and planarized, followed by the opening of a storage node contact hole, and a bit line contact hole, in IPO-1, exposing LDD regions, in the DRAM region. After forming a storage node contact structure, and a bit line contact structure, in these openings, a capacitor structure is formed overlying the storage node contact structure. After deposition and planarization of a second inter-polysilicon oxide, (IPO-2), layer, an opening is formed, exposing the top surface of the bit line contact structure, followed by deposition of a conductive layer, completely filling on the opening, and overlying the top surface of IPO-2. Patterning of the conductive layer results in the formation of a bit line structure, located on the top surface of IPO-2.

Prior to deposition of IPO-2, polysilicon plug structures, can be formed in self-aligned contact openings, located between gate structures, in the logic device region. Subsequent openings in IPO-2, exposing the self-aligned polysilicon plug structures, are then filled with an overlying metal layer, followed by a patterning procedure, resulting in metal interconnect structures, for the logic device region.

BRIEF DESCRIPTION OF THE DRAWINGS

The object and other advantages of this invention are best described in the preferred embodiment with reference to the attached drawings that include:

FIGS. 1–11, 12A, 12B, 13A, 13B and 14, which schematically, in cross-sectional style, describe the key stages of fabrication, used to create logic devices, and DRAM devices, on the same semiconductor chip, using an integrated process sequence.

DESCRIPTION OF THE PREFERRED EMBODIMENTS

Figure 3:
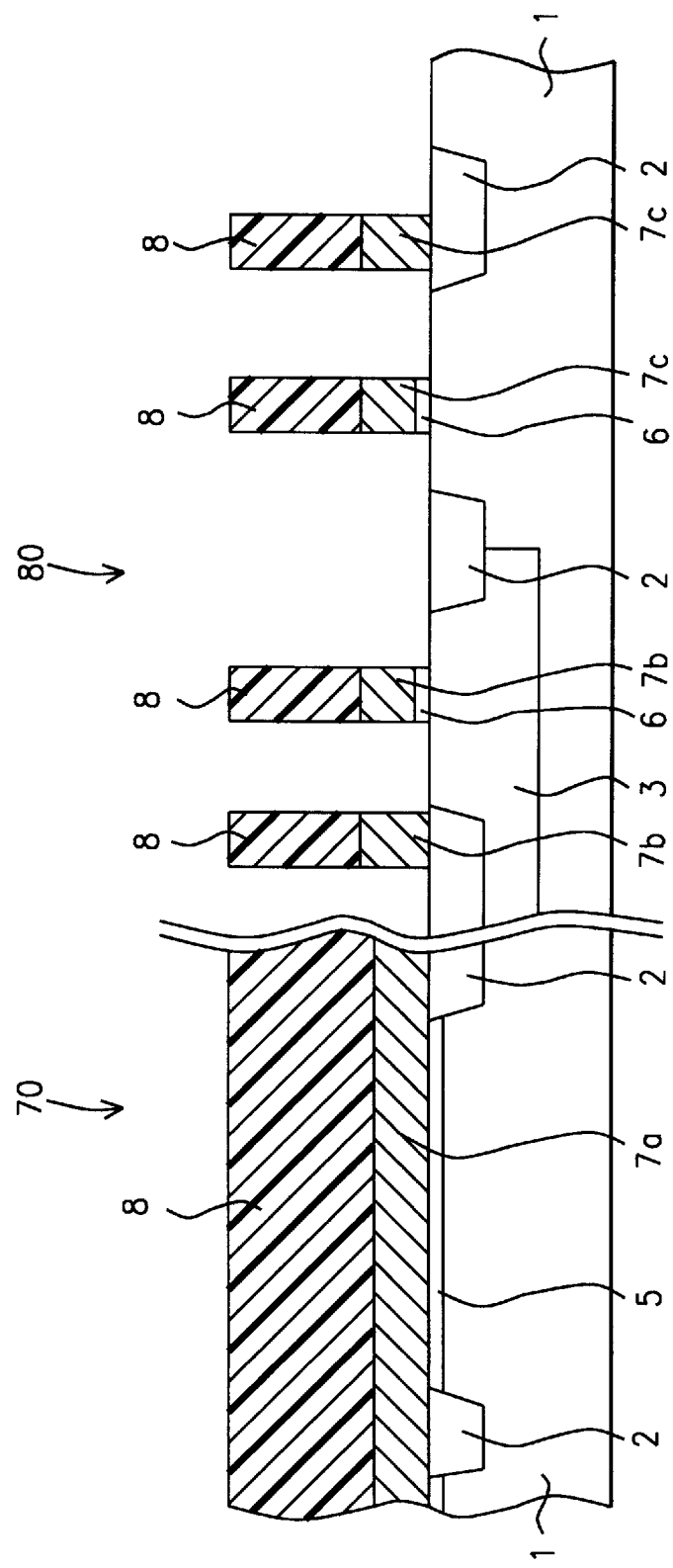

The method of integrating the fabrication of logic devices, and DRAM devices, on the same semiconductor chip, will now be described in detail. A P type, semiconductor substrate 1, comprised of single crystalline silicon, with a <100> crystallographic orientation, is used and schematically shown in FIG. 1. A first region 70, of semiconductor substrate 1, will be used for DRAM devices, while a second region 80, of semiconductor substrate 1, will be used for fabrication of CMOS logic devices. Isolation regions 2, are first formed via conventional processing procedures, comprised of either thermally grown, silicon dioxide, field oxide regions, (FOX), or of insulator filled, shallow trench regions. Conventional photolithographic, and ion implantation procedures, are next employed to from N well region 3, in logic region 80, shown schematically in FIG. 1, to be used for subsequent PFET logic devices. Dual gate insulator layers are next formed, in DRAM region 70, and logic region 80. First a silicon dioxide layer, is thermally grown on the entire surface of semiconductor substrate 1, at a thickness between about 40 to 60 Angstroms. A photoresist shape is then used as a mask to protect the silicon dioxide layer, located in DRAM region 70, from a buffered hydrofluoric acid solution, used to remove the silicon dioxide layer from the surface of semiconductor substrate in logic region 80. After removal of the photoresist shape, via plasma oxygen ashing and careful wet cleans, a second thermal oxidation procedure is performed, resulting in the formation of silicon dioxide, gate insulator layer 6, in logic region 80, at a thickness between about 25 to 35 Angstroms. The second thermal oxidation procedure results in additional growth of the silicon dioxide layer, in DRAM region 70, resulting in the formation of silicon dioxide gate insulator layer 5, now at a thickness between about 60 to 80 Angstroms. This is schematically shown in FIG. 2. An undoped polysilicon layer 7a, also shown schematically in Fig, 2, is next deposited, via use of a low pressure chemical vapor deposition, (LPCVD), procedure, at a thickness between about 1500 to 2500 Angstroms.

FIG. 3, schematically shows the formation of polysilicon gate structures, in logic region 80. Photoresist shape 8, is used as an etch mask, allowing an anisotropic RIE procedure, using $Cl_2$ as an etchant, to define polysilicon gate structures 7b, to be used for the P channel, or PFET devices, in logic region 80, and to define polysilicon gate structures 7c, to be used for the N channel, or NFET devices, in logic region 80. Photoresist shape 8, is removed via plasma oxygen ashing and careful wet cleans. The wet clean cycle, used after plasma oxygen ashing, is comprised with a buffered hydrofluoric acid step, used to remove polymer generated by the plasma etching, also results in partial removal of the regions of silicon dioxide gate insulator 6, not covered by the polysilicon gate structures.

Figure 4:
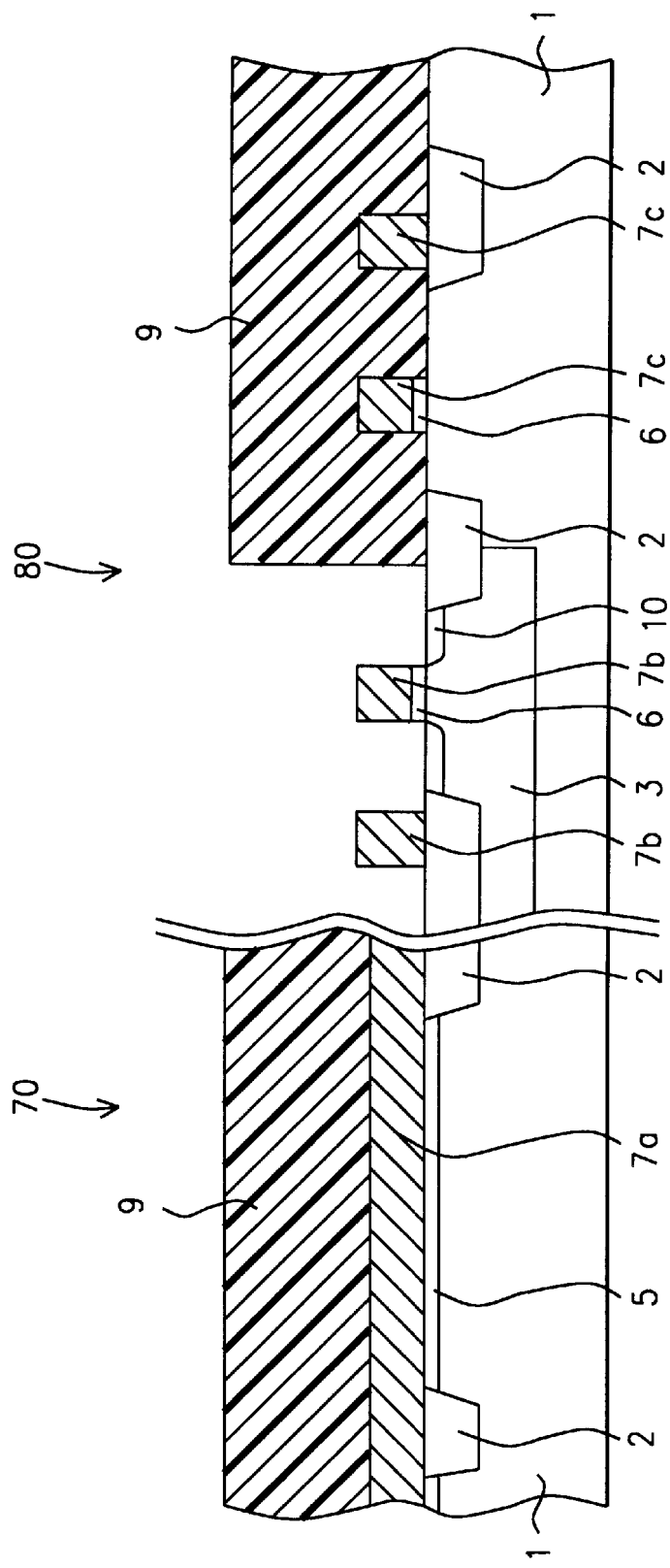
Figure 5:
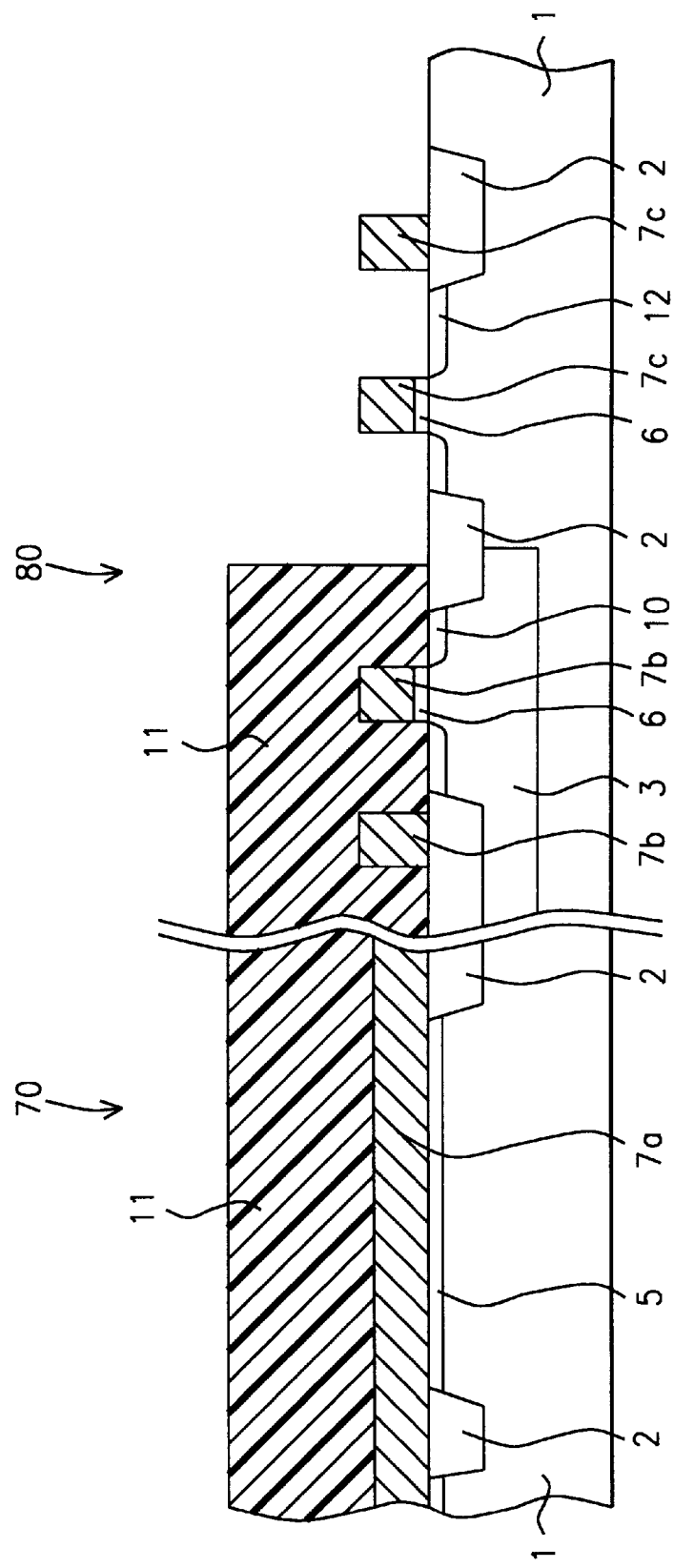

The creation of lightly doped source/drain, (LDD), regions, for the NFET and PFET devices, in logic region 80, are next addressed and schematically shown in FIGS. 4–5. Photoresist shape 9, is used as a block out mask to protect DRAM region 70, and to protect the portion of logic region 80, to be used for the NFET logic devices, from an ion implantation procedure, used to create lightly doped source/drain region 10, in an area of logic region 80, not covered by polysilicon gate structure 7b, to be used for the PFET logic devices. Lightly doped source/drain region 10, is formed via ion implantation of boron or $BF_2$ ions, at an energy between about 10 to 50 KeV, and at a dose between about 1E13 to 1E14 atoms/cm$^2$. After removal of photoresist shape 9, via plasma oxygen ashing and careful wet cleans, photoresist shape 11, is formed, and used as a block out mask, allowing N type, lightly doped source/drain region 12, to be formed in an area of logic region 80, not covered by polysilicon gate structure 7c. N type, lightly doped source/drain region 12, is formed via ion implantation of arsenic, or phosphorous ions, at an energy between about 20 to 60 KeV, at a dose between about 1E13 to 1E14 atoms/cm$^2$. Photoresist shape 11, is removed via plasma oxygen ashing and careful wet cleans.

An insulator layer, comprised of silicon nitride, or silicon oxide, is next deposited, via LPCVD or via plasma enhanced chemical vapor deposition, (PECVD), procedures, at a thickness between about 500 to 2000 Angstroms. An anisotropic RIE procedure, using $CHF_3$ as an etchant, is then used to create insulator spacers 13, on the sides of polysilicon gate structures 7b, and 7c. This is schematically shown in FIG. 6. The blanket insulator layer, which resided on the top surface of undoped polysilicon layer 7a, in DRAM region 70, was totally removed during the anisotropic RIE procedure, used to form insulator spacers 13.

Figure 8:
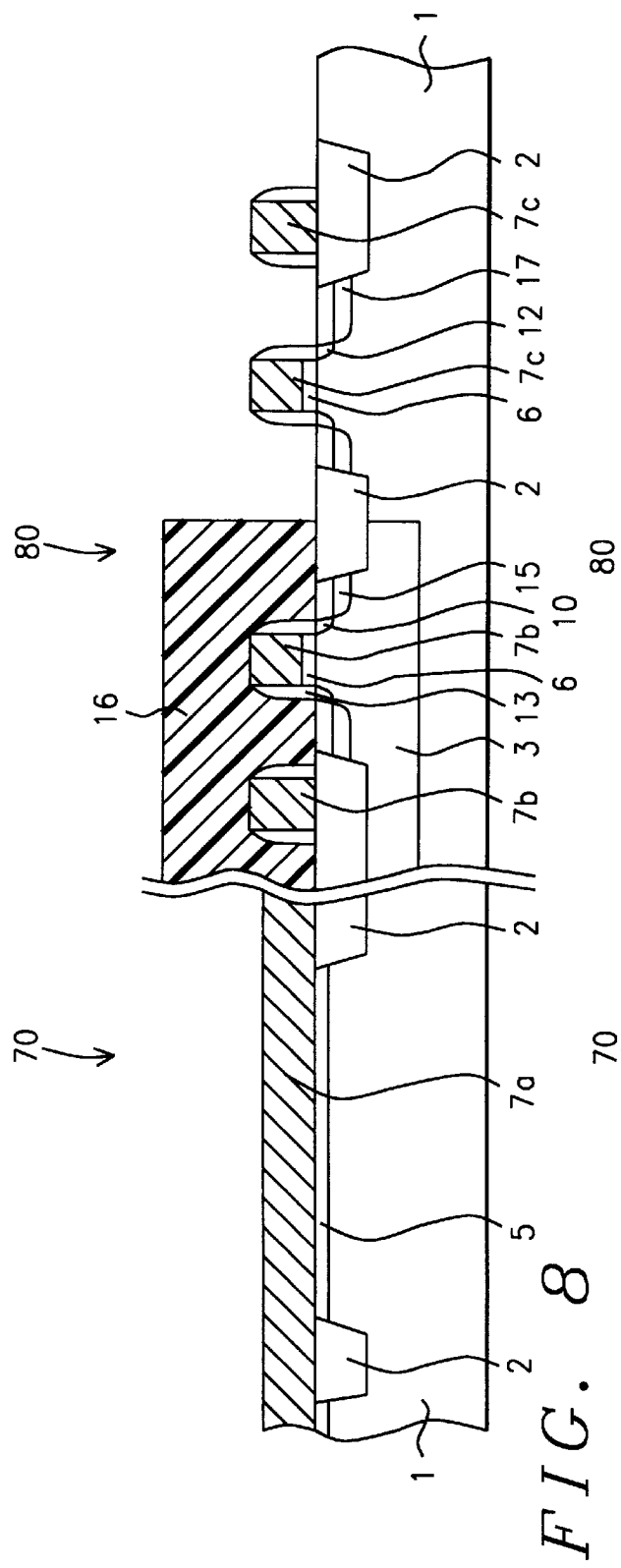

Photoresist shape 14, is next formed and used as a block out mask, to allow P type, heavily doped source/drain region 15, to be created in the area of logic region 80, to be used for the PFET logic devices. P type, heavily doped source/drain region 15, shown schematically in FIG. 7, is formed via ion implantation of boron, or $BF_2$, at an energy between about 10 to 50 KeV, at a dose between about 1E15 to 5E15 atoms/cm$^2$. The ion implantation procedure also results in the P type doping of polysilicon gate structures 7b. Photoresist shape 14, is removed via plasma oxygen ashing and careful wet cleans. A rapid thermal anneal, (RTA), procedure, can at this time be used to activate the P type ions, in heavily doped, source/drain region 15, and in polysilicon gate structures 7b, if desired, or the activation of these regions can be accomplished during a subsequent RTA procedure, used for metal silicide formation. Photoresist shape 16, is then formed, and used to protect the PFET logic devices, in logic region 80, from an N type, ion implantation procedure, used to create N type, heavily doped source/drain region 17, shown schematically in FIG. 8, in an area of the NFET region, not covered by polysilicon gate structure 7c. The ion implantation procedure, using arsenic ions, at an energy between about 30 to 50 KeV, at a dose between about 1E15 to 5E15 atoms/cm$^2$, also results in the N type doping of polysilicon gate structures 7c, as well as the N type doping of unprotected, blanket polysilicon layer 7a, in DRAM region 70. The removal of photoresist shape 16, is again accomplished via plasma oxygen ashing and careful wet cleans. Again an RTA procedure, used to activate the N type dopants in heavily doped source/drain region 17, in polysilicon gate structures 7c, and in polysilicon layer 7a, is an option, or the activation of these regions can be delayed until the RTA procedure used for the formation of metal silicide layers. However it should be noted that the doping of polysilicon layer 7a, allows subsequent gate structures, for DRAM devices, to be accomplished without a specific photolithographic masking step, used specifically for that purpose.

Figure 9:
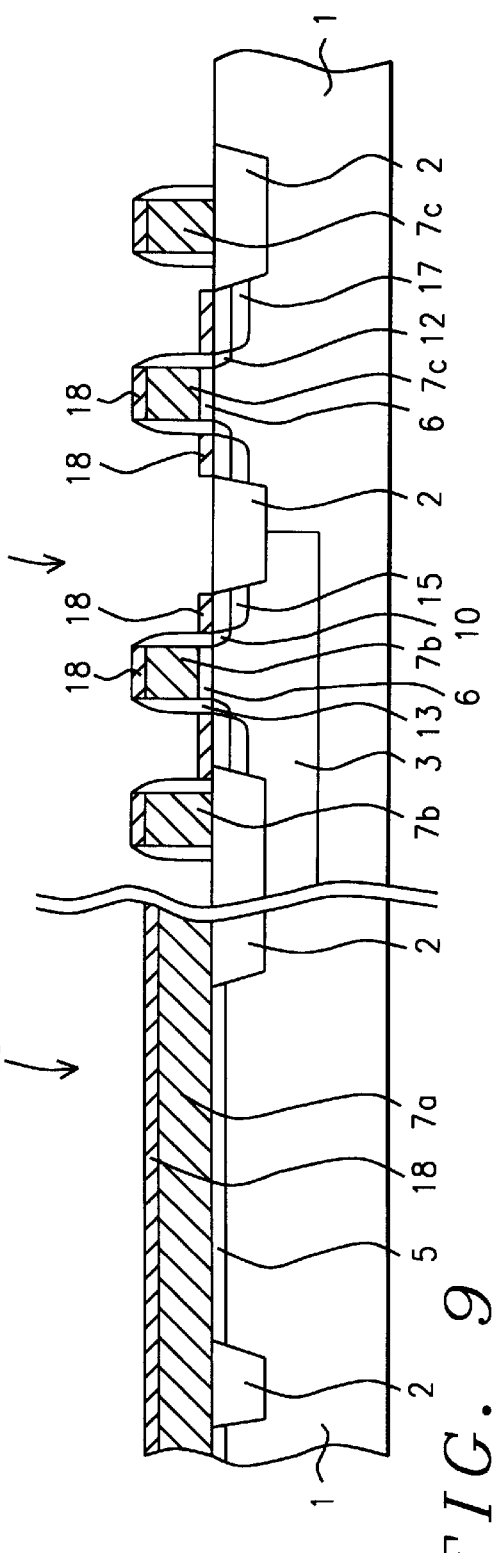

FIG. 9, schematically shows the formation of a metal silicide layer, on the exposed silicon or polysilicon surfaces. A layer of titanium, or cobalt, is deposited via R.F. sputtering, at a thickness between about 50 to 150 Angstroms. A first RTA procedure is performed at a temperature between about 500 to 700° C., for a time between about 10 to 30 sec, in nitrogen ambient, selectively forming metal silicide layer 18, either titanium silicide, or cobalt silicide, on: N type, heavily doped source/drain region 17; on P type, heavily doped source/drain region 15; on the top surface of polysilicon gate structures 7b, and 7c; and on the top surface of polysilicon layer 7a, in DRAM region 70. The salicide, (Self Aligned silICIDE), layer, forms only on exposed silicon or polysilicon regions, while the metal layer remains unreacted on insulator spacers 13, or on isolation regions 2. The unreacted metal is selectively removed in a solution comprised of $H_2O_2$, $H_2SO_4$, and $NH_4OH$, at a temperature between about 30 to 200° C. A second RTA procedure is then employed, at a temperature between about 700 to 900° C., for a time between about 10 to 30 sec, in a nitrogen ambient, to increase the conductivity of metal silicide layer 18. It should be noted that all gate structures, polysilicon gate structures 7b, and 7c, and subsequent DRAM polysilicon gate structure, were all salicided during this sequence, with subsequently formed, DRAM lightly doped source/drain regions, intentionally not participating in the salicide procedure.

Figure 10:
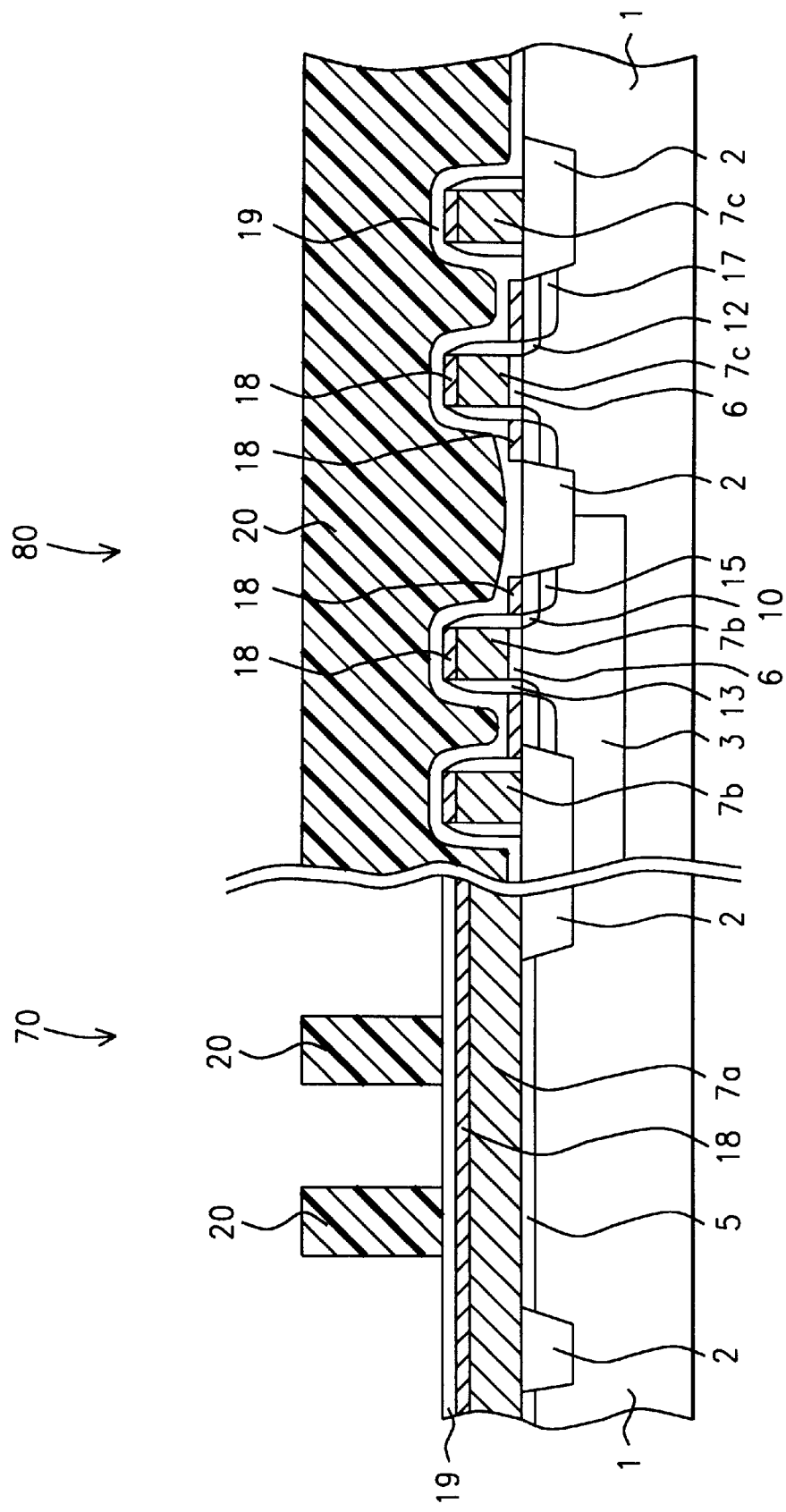
Figure 11:
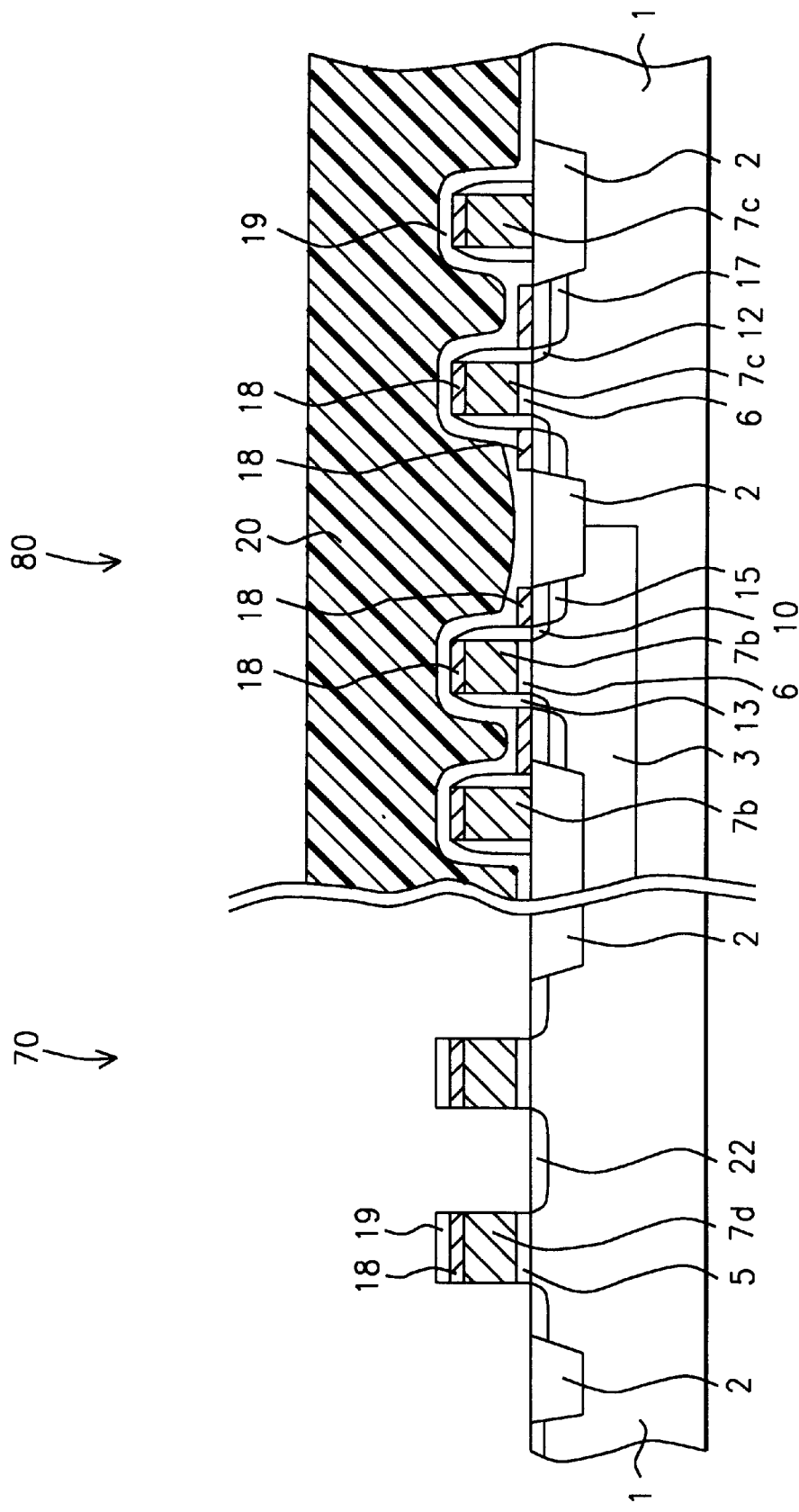

Insulator layer 19, shown schematically in FIG. 10, comprised of either silicon nitride, or silicon oxynitride, is next deposited via LPCVD or PECVD procedures, at a thickness between about 1000 to 2000 Angstroms. Insulator 19, will allow subsequent self-aligned contact openings, to be created between gate structures in logic region 80. Photoresist shape 20, also shown schematically in FIG. 10, is formed, and then used as an etch mask, to allow polysilicon gate structures 7d, to be formed in DRAM region 70, via an anisotropic RIE procedure, using $Cl_2$ or $SF_6$ as an etchant for insulator layer 19, for metal silicide layer 18, and for polysilicon layer 7a. This is shown schematically in FIG. 11. At this point, with photoresist shape 20, still in place, N type, lightly doped source/drain region 21, shown schematically in FIG. 11, can be formed in unprotected regions of DRAM region 70, via an ion implantation procedure. If desired photoresist shape 20, can first be removed via plasma oxygen ashing and careful wet cleans, then followed by the ion implantation procedure, creating N type, lightly doped source/drain region 22, in an area of DRAM region 70, not covered by polysilicon gate structures 7d. Insulator layer 19, protects logic region 80, from the N type, lightly doped source/drain region, performed using arsenic, or phosphorous ions, at an energy between about 20 to 50 KeV, at a dose between about 1E13 to 1E14 atoms/cm². Regions of gate insulator layer 5, not covered by polysilicon gate structures 7d, were removed during the wet clean cycle, of the photoresist removal procedure. Activation of the dopants in N type, lightly doped source/drain region 22, can be accomplished, if desired via use of an RTA procedure. It should be noted that N type, lightly doped source/drain region 22, was formed without an additional photo masking step, and avoided salicide formation, which if performed can result in junction leakage in the DRAM cell.

Figure 12A:
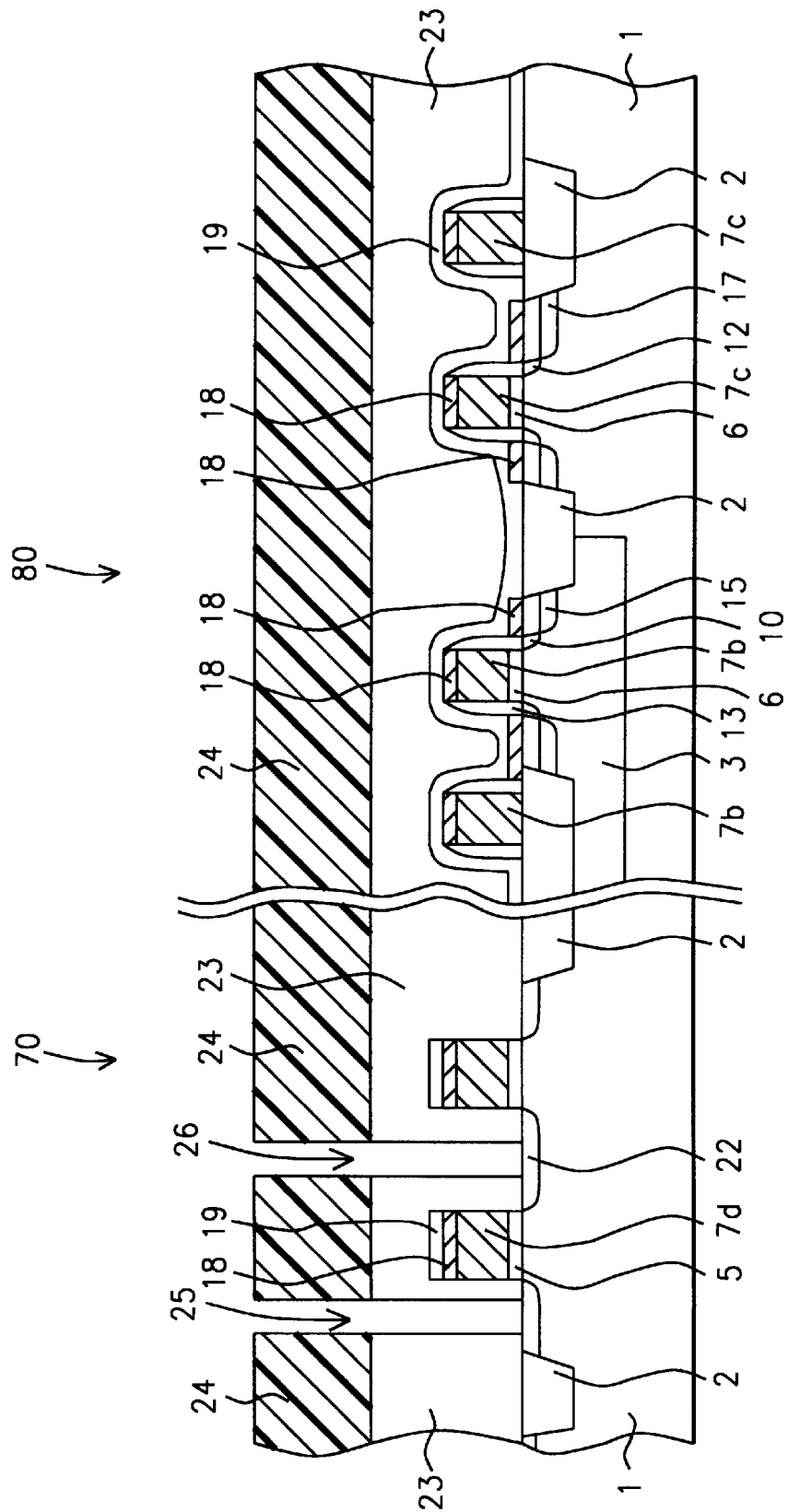
Figure 12B:
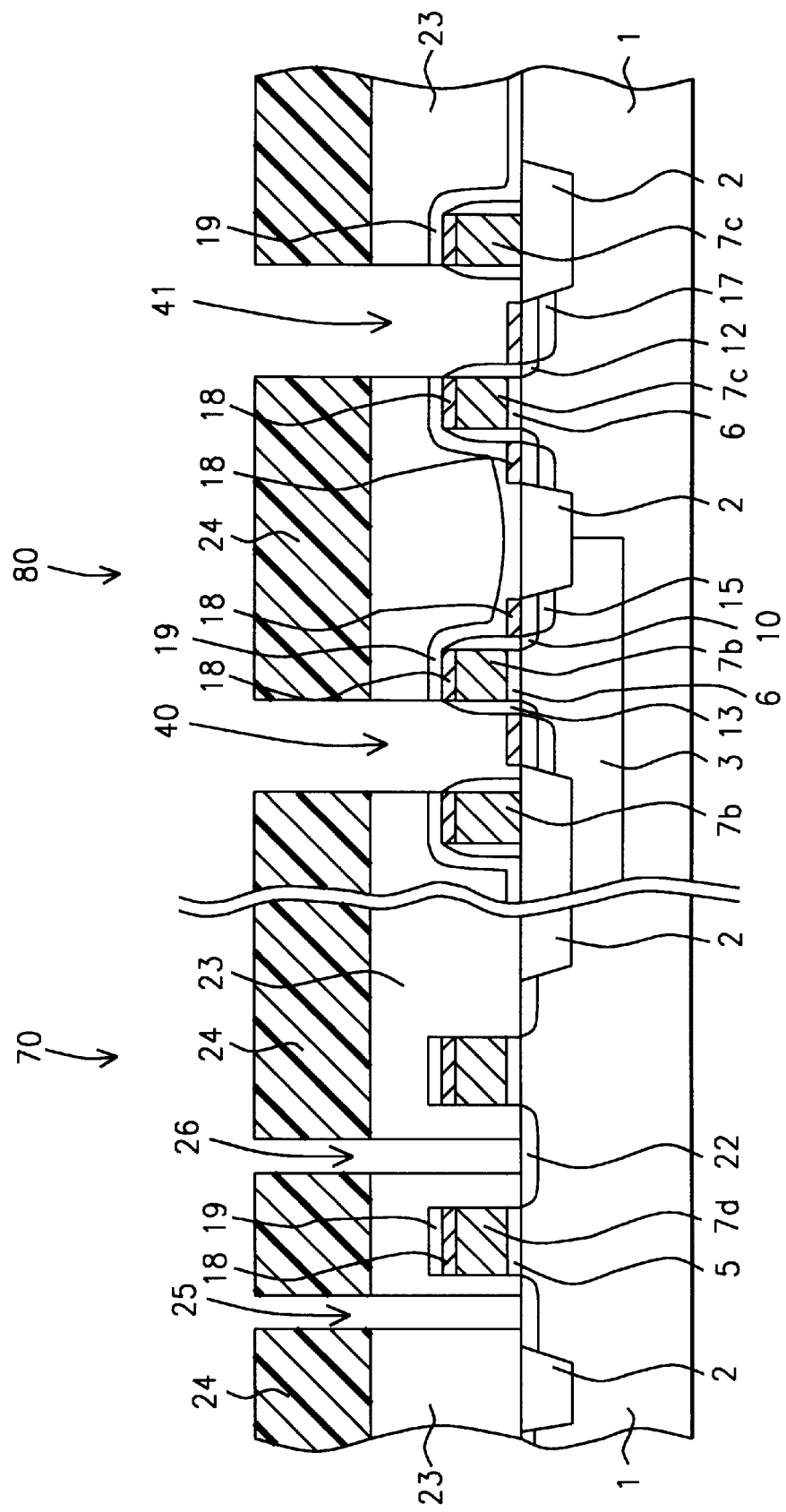

A first inter-polysilicon oxide, (IPO-1), layer 23, comprised of silicon oxide, is next deposited, via LPCVD or PECVD procedures, at a thickness between about 5000 to 7000 Angstroms. A chemical mechanical polishing procedure is used to planarize IPO-1 layer 23 resulting in a smooth top surface topography, shown schematically in FIG. 12A. Photoresist shape 24, is formed, and used as a mask to allow the opening of storage node contact hole 25, as well as the opening of bit line contact hole 26, accomplished via an anisotropic RIE procedure, using $CHF_3$ as an etchant, exposing a portion of the top surface of N type, lightly doped source/drain region 22, in DRAM region 70. In addition, self-aligned contact opening 40, can be formed during this anisotropic RIE procedure, exposing the top surface of metal silicide layer 18, in a region overlying P type, heavily doped source/drain region 15, while self-aligned contact opening 41, can be formed exposing the top surface of metal silicide layer 18, in a region overlying N type, heavily doped source/drain region 17. The self-aligned contact openings, shown schematically in FIG. 12B, are formed with a diameter greater than the space between gate structures, allowing a subsequent contact structure to be placed, self-aligned to the adjacent gate structures.

Figure 13A:
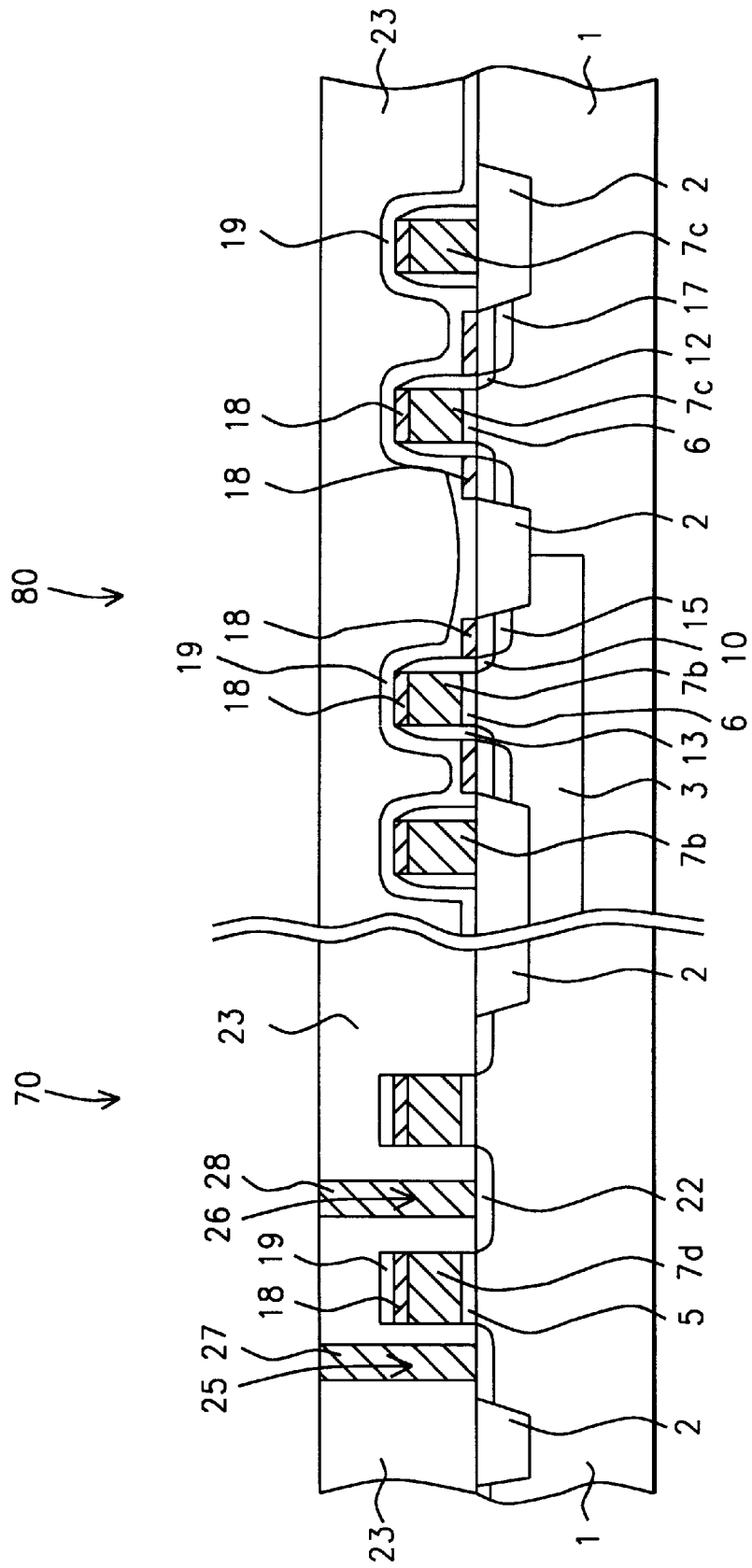
Figure 13B:
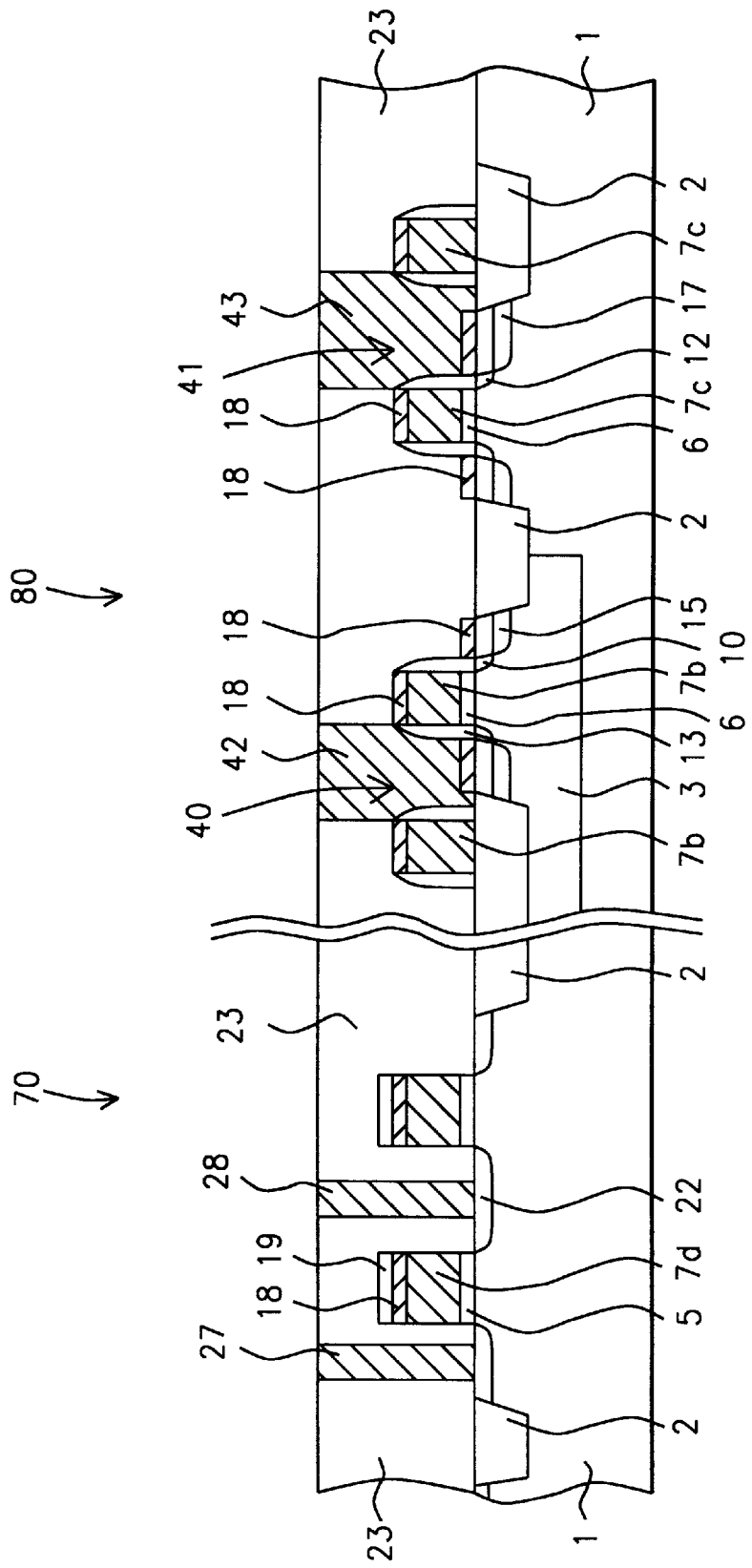

After removal of photoresist shape 24, via plasma oxygen ashing, and careful wet cleans, a conductive material, such as in situ doped polysilicon, or tungsten, is deposited via LPCVD procedures, at a thickness between about 3000 to 5000 Angstroms, completely filling storage node contact opening 25, and bit line contact opening 26, schematically shown in FIG. 13A, while also completely filling self-aligned contact openings 40, and 41, schematically shown in FIG. 13B. The in situ doped polysilicon layer, is obtained via the addition of arsine, or phosphine, to a silane ambient, during the LPCVD procedure. Removal of the regions of the conductive material, residing on the top surface of IPO-1 layer 23, is accomplished via either a chemical mechanical polishing procedure, or via a selective RIE procedure, using $Cl_2$ as an etchant, resulting in the formation of storage node contact structure 27, and bit line contact structure 28, in DRAM region 70, as well as self-aligned contact structures 42, and 43, in logic region 80. This is schematically shown in FIG. 13B.

Figure 14:
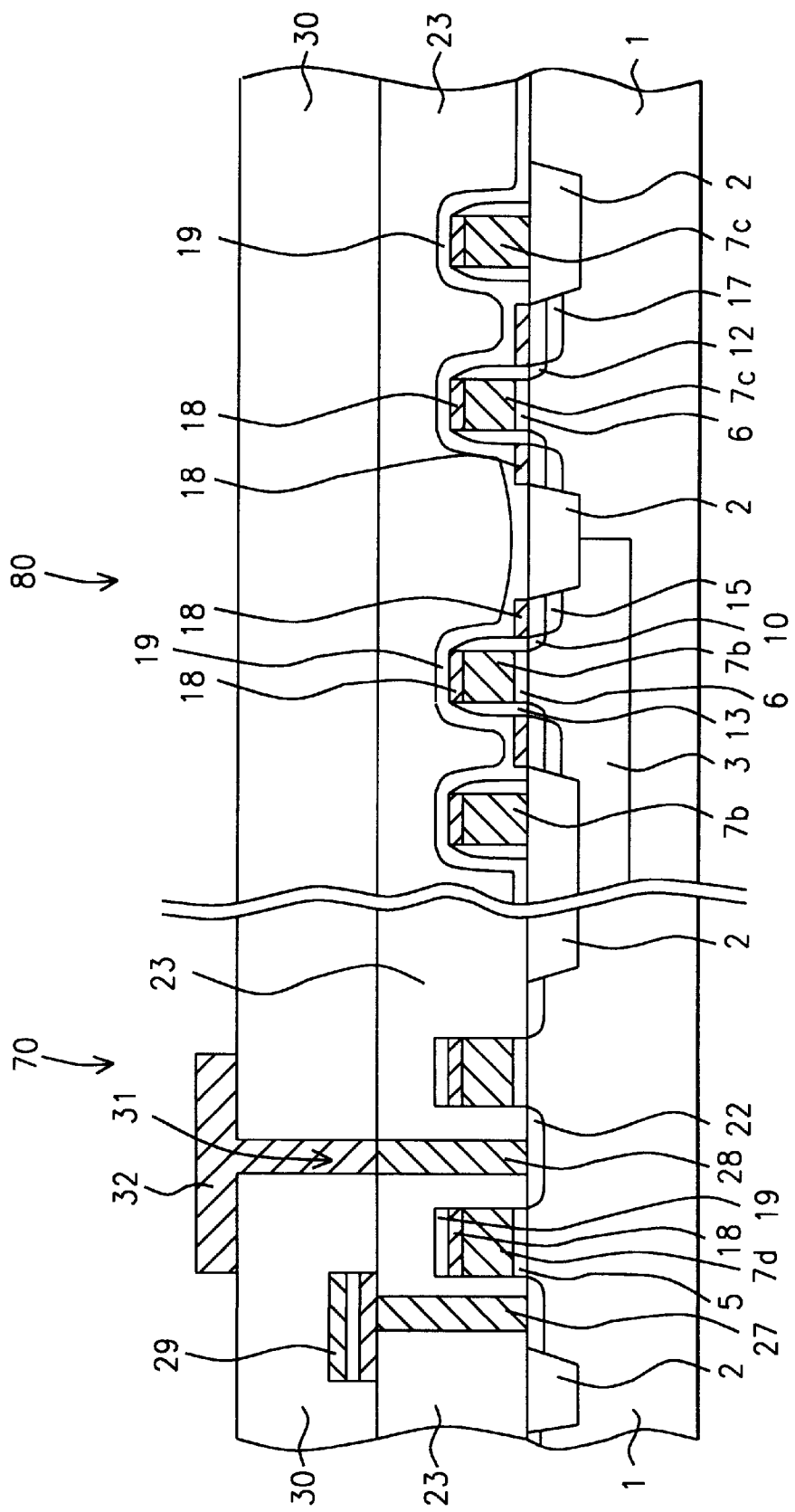

Capacitor structure 29, comprised of an underlying polysilicon storage node, shape, a capacitor dielectric layer, such as a tantalum oxide layer, or an ONO, (Oxidized Nitride on Oxide), layer, and an overlying upper polysilicon plate shape, is formed on the top surface of IPO-1 layer 23, via conventional deposition, and patterning procedures, overlying and contacting storage node contact structure 27. Capacitor structure 29, can be comprised with a crown shape configuration, to increase capacitor surface area, or a hemispherical grained silicon layer can be formed on the top surface of the storage node shape, again to increase the surface area of the capacitor, resulting in DRAM capacitance, and performance increases. This is schematically shown in FIG. 14. A second inter-polysilicon oxide, IPO-2 layer 30, is next deposited, via LPCVD or PECVD procedures, at a thickness between about 4000 to 6000 Angstroms. After planarization of IPO-2 layer 30, again via a chemical mechanical polishing procedure, via hole 31, is opened in IPO-2 layer 30, via conventional photolithographic and anisotropic RIE procedures, using $CHF_3$ as an etchant, exposing the top surface of bit line contact structure 28. Deposition of a conductive material, such as tungsten, or an aluminum based layer, is next accomplished via LPCVD or R.F. sputtering, at a thickness between about 3000 to 5000 Angstroms, completely filling via hole 31. Conventional photolithographic and selective RIE procedures, using $Cl_2$ as an etchant, are used to create bit line structure 32, schematically shown in FIG. 14. The opening of via hole 31, can be accompanied by the opening of additional via holes, in IPO-2 layer 30, exposing the top surface of self-aligned contact structures 42, and 43, in logic region 80. This is not shown in the drawings. The subsequent deposition, and patterning of a conductive layer, would then result in metal interconnect structures, located on the top surface of EPO-2 layer 30, communicating with the CMOS logic devices, in logic region 80. The removal of the photoresist shape, used for definition of bit line structure 32, is again removed via plasma oxygen ashing and careful wet cleans.

While this invention has been particularly shown and described with reference to the preferred embodiments thereof, it will be understood by those skilled in the art that various changes in form and details made be made without departing from the spirit or scope of this invention.

What is claimed is:

1. A method of fabricating logic devices, and dynamic random access memory, (DRAM), devices, on the same semiconductor chip, using an integrated fabrication process, comprising the steps of:

providing a first region, or a DRAM device region, of a semiconductor substrate, to be used for fabrication of said DRAM devices, and providing a second region, or a logic device region, of said semiconductor substrate, to be used for said logic devices;

forming isolation regions in said semiconductor substrate;

forming an N well region, in a first portion, of said logic device region of said semiconductor substrate, to be used for P channel, or PFET logic devices;

growing a first gate insulator layer on said logic device region;

growing a second gate insulator layer on said DRAM device region;

depositing an undoped polysilicon layer;

patterning of said undoped polysilicon layer, in said logic device region, to form undoped polysilicon gate structures, on said second gate insulator layer;

forming a P type, lightly doped source/drain region, in an area of said first portion, of said logic device region, not covered by a first group of undoped polysilicon gate structures;

forming N type, lightly doped source/drain regions, in an area of a second portion, of said logic device region, not covered by a second set of said of undoped polysilicon gate structures;

forming insulator spacers on said undoped polysilicon gate structures;

performing a P type, ion implantation procedure: to form a P type, heavily doped source/drain region, in an area of said first portion of said logic device region, not covered by said first group of undoped polysilicon gate structures, and not covered by the insulator spacers, on said first group of undoped polysilicon gate structures; and to convert said first group of undoped polysilicon gate structures, to P type doped, polysilicon gate structures;

performing an N type, ion implantation procedure: to form an N type, heavily doped source drain region in an area of said second portion of said logic device region, not covered by said second set of undoped polysilicon gate structures, and not covered by said insulator spacers, on the sides of said second set of undoped polysilicon gate structures; to convert said second group of undoped polysilicon gate structures, to N type doped, polysilicon gate structures; and to convert the region of undoped polysilicon layer, in said DRAM device region, to a N type doped, polysilicon layer;

forming a metal silicide: on said P type, heavily doped source/drain region; on said N type, heavily doped source/drain region; on said P type doped, polysilicon gate structures; on said N type doped, polysilicon gate structures; and on said N type doped, polysilicon layer, in said DRAM device region;

depositing a capping insulator layer;

patterning of said capping insulator layer, of said metal silicide layer, and of said N type doped, polysilicon layer, to form DRAM gate structures, in said DRAM device region, comprised of said capping insulator layer, said metal silicide layer, and of said N type doped, polysilicon layer;

forming DRAM, N type lightly doped source/drain regions, in areas of said DRAM device region not covered by said DRAM gate structures;

forming a first planarized insulator layer;

forming a first opening in said first planarized insulator layer, exposing a portion of the top surface of a first DRAM, N type, lightly doped source/drain region, and forming a second opening in said first planarized insulator layer, exposing a portion of the top surface of a second DRAM, N type, lightly doped source/drain region;

forming a storage node contact structure, in said first opening, in said first planarized insulator layer, and forming a bit line contact structure, in said second opening, in said first planarized insulator layer;

forming a capacitor structure on the top surface of said first planarized insulator layer, overlying, and contacting, the top surface of said storage node contact structure;

forming a second planarized insulator layer;

forming a via hole, in said second planarized insulator layer, exposing the top surface of said bit line contact structure; and forming a bit line structure, in said via hole, with the bit line structure overlying a portion of the top surface of said second planarized insulator layer.

2. The method of claim 1, wherein said first gate insulator layer, in said logic device region, is a silicon dioxide layer, thermally grown to a thickness between about 25 to 35 Angstroms.

3. The method of claim 1, wherein said second gate insulator layer, in said DRAM device region, is a silicon dioxide layer, thermally grown to a thickness between about 60 to 80 Angstroms.

4. The method of claim 1, wherein said undoped polysilicon layer, is obtained via LPCVD procedures at a thickness between about 1500 to 2500 Angstroms.

5. The method of claim 1, wherein said insulator spacers, on the sides of said undoped polysilicon gate structures, are comprised of silicon nitride, or silicon oxide, obtained via deposition of silicon nitride, or silicon oxide, via LPCVD or PECVD procedures, to a thickness between about 500 to 2000 Angstroms, then defined via an anisotropic RIE procedure, using $CHF_3$ as an etchant.

6. The method of claim 1, wherein said P type, ion implantation procedure, used to create said P type, heavily doped source/drain region, and said P type doped, polysilicon gate structures, is performed using boron, or $BF_2$ ions, at an energy between about 10 to 50 KeV, at a dose between about 1E15 to 5E15 atoms/cm$^2$.

7. The method of claim 1, wherein said N type, ion implantation procedure, used to form: said N type, heavily doped source/drain region; said N type doped, polysilicon gate structures; and said N type doped, polysilicon layer, in said DRAM device region, is performed using arsenic ions, at an energy between about 30 to 50 KeV, at a dose between about 1E15 to 5E15 atoms /cm$^2$.

8. The method of claim 1, wherein said metal silicide layer is comprised of either titanium silicide, or a cobalt silicide.

9. The method of claim 1, wherein said capping insulator layer is either a silicon oxynitride layer, or a silicon nitride layer, obtained via LPCVD or PECVD procedures, to a thickness between about 1000 to 2000 Angstroms.

10. The method of claim 1, wherein said first planarized insulator layer, is a silicon oxide layer, formed via LPCVD or PECVD procedures, at a thickness between about 5000 to 7000 Angstroms, and planarized via a chemical mechanical polishing procedure.

11. A method of fabricating logic devices, and DRAM devices, on the same semiconductor chip, using an integrated fabrication process that features: the simultaneous formation of a metal silicide layer, on the top surface of all gate structures; the doping of the DRAM gate structure, without additional masking; the formation of a metal silicide layer in the logic device, source/drain regions, while avoiding the formation of the metal silicide layer in the DRAM device, source/drain region, comprising the steps of:

providing a logic device region, in a first region, of a semiconductor substrate, while providing a DRAM device region, in a second region, of said semiconductor substrate;

forming silicon oxide, isolation regions, in said semiconductor substrate;

forming an N well region, in a first portion of said logic device region, to be used for a PFET logic device region, while a second portion of said logic device region is to be used for an NFET logic device region;

forming a first silicon dioxide gate layer, on the surface of said DRAM device region;

forming a second silicon dioxide gate layer, on the surface of said logic device region;

depositing an undoped polysilicon layer;

patterning of said undoped polysilicon layer, to form undoped polysilicon gate structures, on said second silicon dioxide gate layer, in said PFET device region, and in said NFET device region;

forming a P type, lightly doped source/drain region, in an area of said PFET device region, not covered by a first group of said undoped polysilicon gate structures;

forming an N type, lightly doped source/drain region, in an area of said NFET device region, not covered by a second group of said undoped polysilicon gate structures;

depositing a first insulator layer;

performing an anisotropic dry etching procedure, to form insulator spacers on the sides of said first group of said undoped gate structures, and on the sides of said second group of said undoped gate structures, while completely removing said first insulator layer, from the top surface of said undoped polysilicon layer, in said DRAM device region;

performing a P type, ion implantation procedure to form a P type, heavily doped source drain region, in an area of said PFET device region, not covered by said first group of said undoped gate structures, or by said first insulator spacer, and converting said first group of said undoped polysilicon gate structures to P type, polysilicon gate structures;

performing an N type, ion implantation procedure to form an N type, heavily doped source/drain region, in an area of said NFET device region, not covered by said second group of said undoped polysilicon gate structures, or by said first insulator spacers, converting said second group of said undoped polysilicon gate structures to N type, polysilicon gate structures, and converting said undoped polysilicon layer, in said DRAM device region, to an N type, polysilicon layer;

depositing a metal layer;

performing an anneal procedure to form a metal silicide layer: on the top surface of said N type, polysilicon gate structure; on the top surface of said P type, polysilicon gate structures; on said P type, heavily doped source/drain regions; on said N type, heavily doped source/drain regions; and on the top surface of said N type, polysilicon layer, in said DRAM device region; while leaving unreacted metal, in regions in which said metal layer resided on said insulator spacers;

removing said unreacted metal;

depositing a second insulator layer;

patterning of said second insulator layer, of said metal silicide layer, and of said N type, polysilicon layer, to create DRAM polysilicon gate structures, on said first silicon dioxide gate layer, in said DRAM device region;

forming DRAM, N type, lightly doped source/drain regions, in an area of said DRAM device region, not covered by said DRAM polysilicon gate structures;

depositing a third insulator layer;

performing a first chemical mechanical polishing procedure, to create a planarized third insulator layer;

forming a first opening in said planarized third insulator layer, exposing a first DRAM, N type, lightly doped source/drain region; forming a second opening in said planarized third insulator layer, exposing a second DRAM, N type, lightly doped source/drain region; forming a third opening in said planarized third insulator layer, and in said second insulator layer, exposing the top surface of a metal silicide layer, which in turn overlays said P type, heavily doped source/drain region; and forming a fourth opening in said planarized third insulator layer, exposing the top surface of a metal silicide layer, which in turn overlays said N type, heavily doped source/drain region;

depositing a first conductive layer, completely filling, said first opening, said second opening, said third opening, and said fourth opening;

removing regions of said first conductive layer, from the top surface of said planarized third insulator layer, creating: a storage node contact structure, in said first opening; a bit line contact structure, in said second opening; a first self-aligned contact structure, in said third opening; and a second self-aligned contact structure, in said fourth opening;

forming a capacitor structure on the top surface of said planarized third insulator layer, with the capacitor structure, overlying, and contacting, the top surface of said storage node contact structure;

depositing a fourth insulator layer;

performing a second chemical mechanical polishing procedure to form a planarized fourth insulator layer;

forming a first opening in said planarized fourth insulator layer, exposing the top surface of said bit line contact structure, and forming a second opening, and a third opening, in said planarized fourth insulator layer, exposing the top surface of said first, and of said second self-aligned contact structure, respectfully;

depositing a second conductive layer, completely filling the openings in said planarized fourth insulator layer; and patterning of said second conductive layer, to from a bit line structure, on the top surface of said planarized fourth insulator layer, overlying, and contacting the atop surface of said bit line contact structure, and forming a first metal interconnect structure, and a second metal interconnect structure, on the top surface of said planarized fourth insulator layer, overlying, and contacting, the top surface of said first self-aligned contact structure, and of said second self-aligned contact structure, respectfully.

12. The method of claim 11, wherein said first silicon dioxide gate layer is thermally grown to a thickness between about 60 to 80 Angstroms.

13. The method of claim 11, wherein said second silicon dioxide gate insulator layer is thermally grown to a thickness between about 25 to 35 Angstroms.

14. The method of claim 11, wherein said undoped polysilicon layer is obtained via LPCVD procedures, to a thickness between about 1500 to 2500 Angstroms.

15. The method of claim 11, wherein said first insulator layer, used for said insulator spacers, is a silicon oxide layer, or a silicon nitride layer, obtained via LPCVD or PECVD procedures, at a thickness between about 500 to 2000 Angstroms.

16. The method of claim 11, wherein said P type, ion implantation procedure, used to create P type, heavily doped source/drain region, and used to provide the dopant for said P type, polysilicon gate structures, is performed using boron, or $BF_2$ ions, at an energy between about 10 to 50 KeV, at a dose between about 1E15 to 5E15 atoms/cm$^2$.

17. The method of claim 11, wherein said N type, ion implantation procedure, used to create N type, heavily doped source/drain region, and used to provide the dopant for said N type, polysilicon gate structures, and for said N type, polysilicon layer, is performed using arsenic ions, at an energy between about 30 to 50 KeV, at a dose between about 1E15 to 5E15 atoms/cm$^2$.

18. The method of claim 11, wherein said metal layer, used to form said metal silicide layer, is a titanium, or a cobalt layer, about via R.F. sputtering, to a thickness between about 50 to 150 Angstroms.

19. The method of claim 11, wherein said second insulator layer is a silicon oxynitride, or a silicon nitride layer, obtained via LPCVD or PECVD procedures, at a thickness between about 1000 to 2000 Angstroms.

20. The method of claim 11, wherein said third insulator layer is a silicon oxide layer, obtained via LPCVD or PECVD procedures, at a thickness between about 5000 to 7000 Angstroms.

21. The method of claim 11, wherein said first conductive layer, used to create said storage node contact structure, said bit line contact structure, and said self-aligned contact structures, is an in situ doped polysilicon layer, obtained via LPCVD procedures, at a thickness between about 3000 to 5000 Angstroms, and doped via the addition of arsine, or phosphine, to a silane ambient.

22. The method of claim 11, wherein said fourth insulator is a silicon oxide layer, obtained via LPCVD or PECVD procedures, at a thickness between about 4000 to 6000 Angstroms.

* * * * *